United States Patent
Park et al.

(10) Patent No.: US 10,175,788 B2
(45) Date of Patent: Jan. 8, 2019

(54) DISPLAY APPARATUS

(71) Applicant: SAMSUNG ELECTRONICS CO., LTD., Suwon-si, Gyeonggi-do (KR)

(72) Inventors: Han Jin Park, Suwon-si (KR); Jean Hur, Seongnam-si (KR); Sun Rock Lee, Cheonan-si (KR); Yong Min Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/457,023

(22) Filed: Mar. 13, 2017

(65) Prior Publication Data

US 2017/0357341 A1 Dec. 14, 2017

(30) Foreign Application Priority Data

Jun. 13, 2016 (KR) .................. 10-2016-0072906

(51) Int. Cl.
| | |
|---|---|
| *G06F 1/16* | (2006.01) |
| *G06F 3/041* | (2006.01) |
| *H03K 17/96* | (2006.01) |
| *H04N 5/64* | (2006.01) |

(52) U.S. Cl.
CPC ............ *G06F 3/041* (2013.01); *G06F 1/1613* (2013.01); *G06F 1/1626* (2013.01); *G06F 1/1637* (2013.01); *G06F 1/1656* (2013.01); *G06F 1/1658* (2013.01); *H03K 17/962* (2013.01); *G06F 2203/04103* (2013.01); *H03K 2217/96031* (2013.01); *H03K 2217/960755* (2013.01); *H04N 5/64* (2013.01)

(58) Field of Classification Search
CPC .... G06F 1/1613; G06F 1/1626; G06F 1/1632; G06F 1/1658; G06F 3/041; G06F 2203/04103; H03K 2217/96031
See application file for complete search history.

(56) References Cited

U.S. PATENT DOCUMENTS

| | | | |
|---|---|---|---|
| 9,720,458 B2 * | 8/2017 | Kang | ............... G06F 1/182 |
| 2015/0077657 A1 * | 3/2015 | Ma | ............... H03K 17/96 |
| | | | 349/12 |
| 2015/0109170 A1 * | 4/2015 | Kang | ............... G06F 1/182 |
| | | | 343/702 |
| 2017/0023981 A1 * | 1/2017 | An | ............... G06F 1/1656 |

FOREIGN PATENT DOCUMENTS

| | | |
|---|---|---|
| KR | 10-2016-0002565 | 1/2016 |
| KR | 10-2016-0033981 | 3/2016 |

* cited by examiner

*Primary Examiner* — Xuemei Zheng
(74) *Attorney, Agent, or Firm* — Nixon & Vanderhye P.C.

(57) ABSTRACT

Disclosed herein are a display apparatus capable of accomplishing common use of instrument and being repaired by installing a touch panel driving board on the outer side of the display apparatus. A display apparatus comprising a display module comprising a display panel configured to display an image, a panel disposed in front of the display module, a first cover disposed behind the display module, and a panel driving board configured to drive the panel, and disposed to be exposed outside of the first cover.

14 Claims, 8 Drawing Sheets

DISPLAY APPARATUS

CROSS-REFERENCE TO RELATED APPLICATION

This application is based on and claims priority under 35 U.S.C. § 119 to Korean Patent Application No. 10-2016-0072906, filed on Jun. 13, 2016 in the Korean Intellectual Property Office, the disclosure of which is incorporated by reference herein in its entirety.

BACKGROUND

1. Field

The present disclosure relates generally to a display apparatus, and for example, to a display apparatus capable of improving the assembling efficiency of a driving board connected to a touch panel.

2. Description of Related Art

In general, a display apparatus is equipment that displays images, such as a television (TV) or a monitor. The display apparatus can be classified into various types according to a method of displaying signal-processed image information on a screen. Recently, a Liquid Crystal Display (LCD) and a Plasma Display Panel (PDP) are widely used. Particularly, the LCD is being used in various fields of applications due to its advantages of low power consumption, high definition, and large screen implementation.

The LCD includes a display panel having a lower substrate and an upper substrate facing each other with a liquid crystal layer in between, and a driving circuit to apply a driving voltage and signals to the display panel. The LCD adjusts the transmittance of light passing through the liquid crystal layer of each of a plurality of cells according to a data voltage to display images according to image signals.

In recent years, instead of input means, such as a mouse, a keyboard, and a remote controller, which has been typically used as an input device for flat panel display, or input means such as a key pad which has been typically used as an input device for portable electronic apparatus, a touch type enabling a user to himself or herself input information on a screen using his/her finger, a pen, or the like is used.

The touch type combines an input device with a display to achieve product miniaturization, so that the touch type is widely used in portable electronic devices. A touch screen panel is classified into a resistive type, a capacitive type, an infrared type, and an ultrasonic type according to a method of receiving a user's commands. The capacitive type among the above-mentioned types is widely used since it can be manufactured with low costs and has high optical transmittance.

SUMMARY

Therefore, it is an example aspect of the present disclosure to provide a display apparatus capable to improving the assembling efficiency of a driving board connected to a touch panel.

It is another example aspect of the present disclosure to provide a display apparatus capable of accomplishing common use and being repaired by installing a touch panel driving board on an outer side of the display apparatus.

It is still another example aspect of the present disclosure to provide a display apparatus capable of improving the workability and service efficiency of a touch panel driving board.

Additional aspects of the disclosure will be set forth in part in the description which follows and, in part, will be apparent from the description.

In accordance with an example aspect of the present disclosure, a display apparatus comprising: a display module including a display panel configured to display an image; a panel disposed in front of the display module; a first cover disposed behind the display module; and a panel driving board configured to drive the panel, and disposed to be exposed to the outside of the first cover.

Further, the display apparatus may include a main board configured to drive the display module, wherein the main board is connectable to the panel driving board.

Further, a second cover may be disposed behind the panel driving board.

Further, the first cover further comprises a rear cover configured to surround at least one portion of the rear surface of the display module.

Further, the rear cover may surround the main board.

Further, the display apparatus may include a panel driving board installing member in which the panel driving board is installed.

Further, the panel driving board installing member may be removably coupled with the first cover.

Further, the panel driving board installing member may comprise an aluminum material.

Further, the panel driving board installing member comprises: an opening portion having at least one opening; and at least one connection portion formed around the opening portion.

Further, the at least one connection portion comprises: a first connection portion to which the panel driving board is connected; and a second connection portion to which the second cover is connected.

According to another example aspect of the present disclosure, a display apparatus comprising: a display module comprising a display configured to display an image; a panel disposed in front of the display module; a first cover forming a rear portion of the display module; a main board disposed inside the first cover, and configured to drive the display module; and a panel driving board disposed to be exposed to the outside of the first cover, and configured to drive the panel.

Further, the display apparatus may include a panel driving board installing member in which the panel driving board is installed, wherein the panel driving board installing member comprises: an opening portion having at least one opening; and at least one connection portion formed around the opening portion.

Further, the display apparatus may include a second cover configured to cover the opening portion, and to surround the panel driving board.

Further, the panel driving board installing member may comprise an aluminum material.

Further, the connection portion comprises: a first connection portion configured to be connected to the panel driving board; and a second connection portion configured to be connected to the second cover.

Further, the main board is connectable to the panel driving board.

According to another example aspect of the present disclosure, a display apparatus comprising: a display module comprising a display configured to display an image; a panel disposed in front of the display module; a main board configured to drive the display module; a first cover configured to cover the main board; an opening portion formed comprising at least one opening formed in the first cover;

and a panel driving board disposed in the opening portion, and configured to drive the panel.

Further, the first cover comprises a panel driving board installing portion in which the panel driving board is removably installed.

Further, the display apparatus may include a second cover configured to cover the opening portion.

Further, the panel driving board installing portion includes an aluminum material.

BRIEF DESCRIPTION OF THE DRAWINGS

These and/or other aspects, features and attendant advantages of the present disclosure will become apparent and more readily appreciated from the following detailed description, taken in conjunction with the accompanying drawings, in which like reference numerals refer to like elements, and wherein.

DETAILED DESCRIPTION

Hereinafter, various example embodiments of the present disclosure will be described in greater detail with reference to the appended drawings. In the following description, the terms "front end", "rear end", "upper portion", "lower portion", "upper end", and "lower end" are defined based on the drawings, and the shapes and positions of the corresponding components are not limited by the terms.

Figure 1:
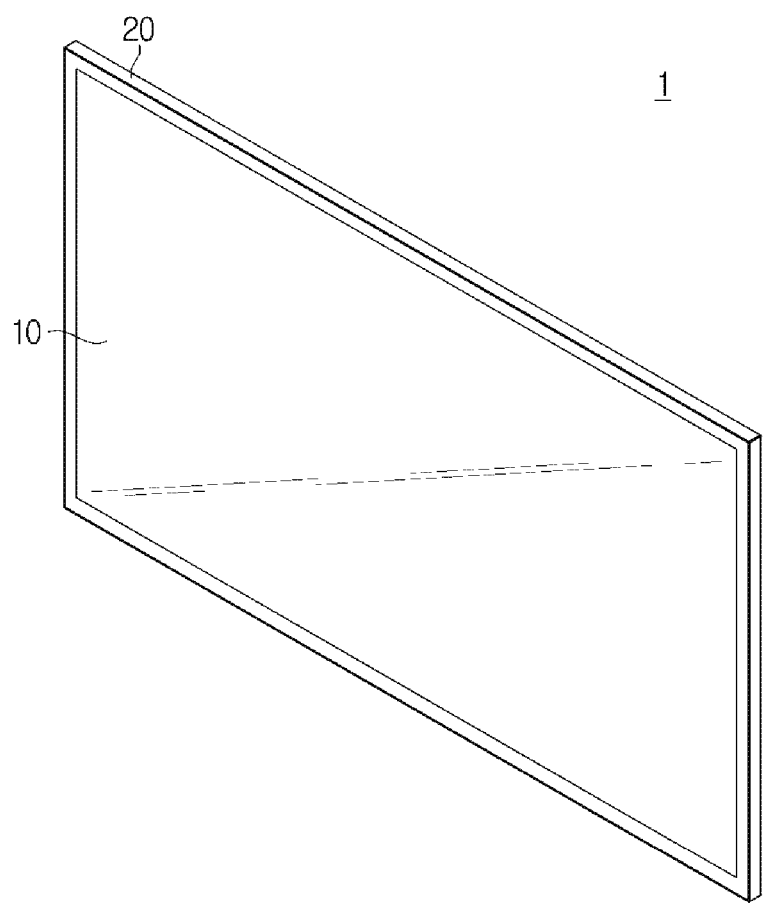
FIG. 1 is a front perspective view of a display apparatus according to an example embodiment of the present disclosure.
Figure 2:
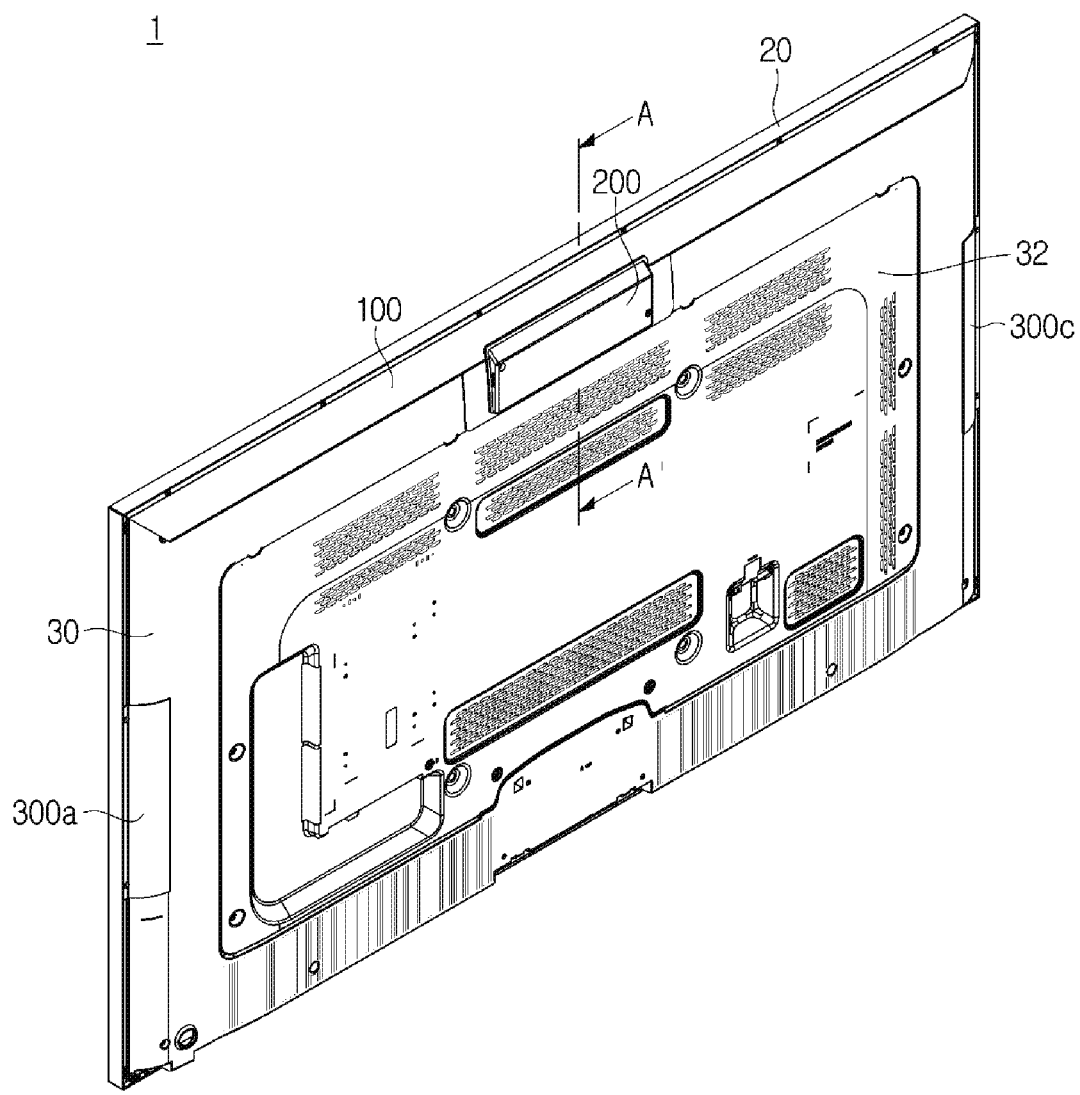
FIG. 2 is a rear perspective view illustrating the rear portion of the display apparatus according to an example embodiment of the present disclosure.
Figure 3:
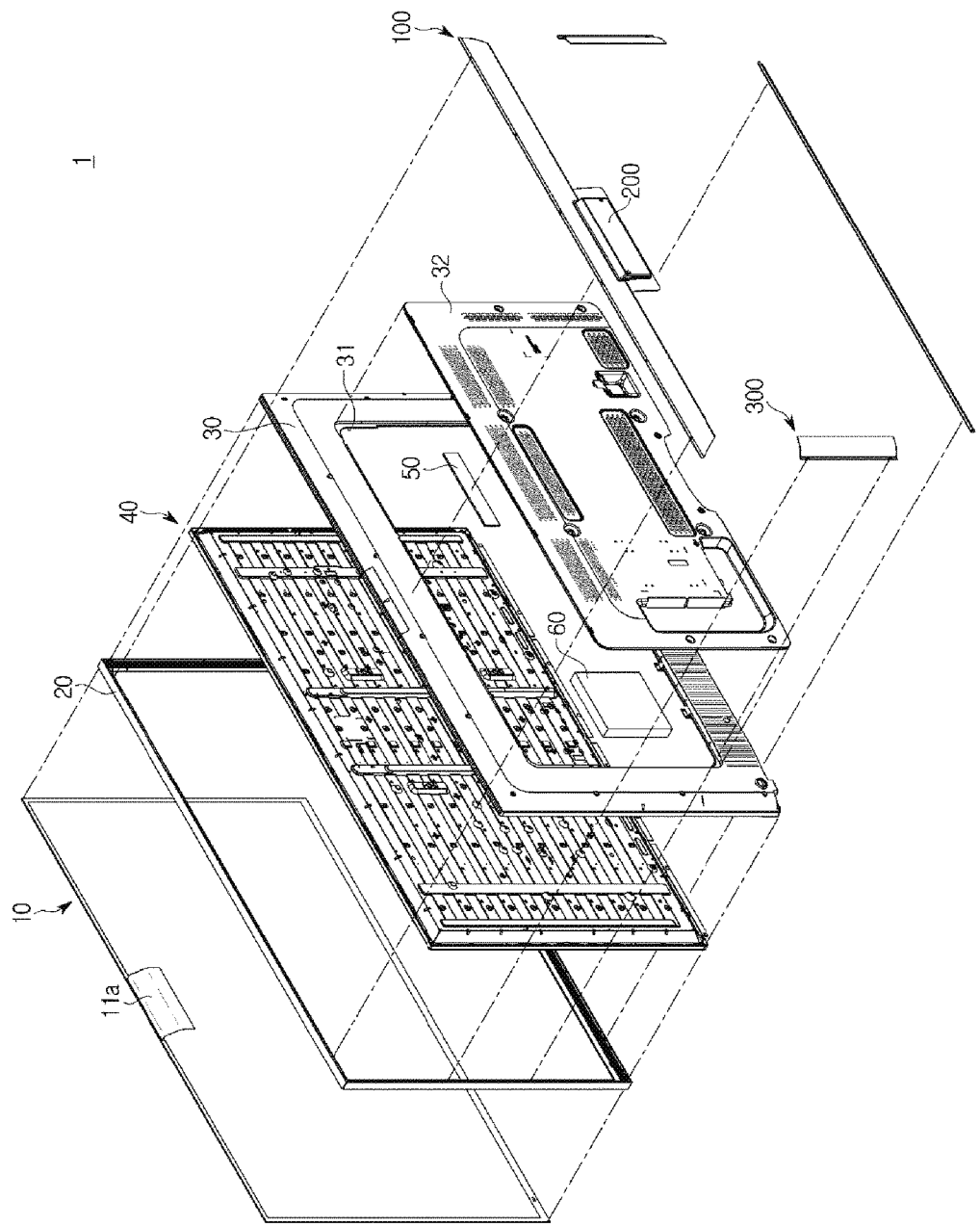
FIG. 3 is an exploded perspective view of the display apparatus according to an example embodiment of the present disclosure.
Figure 4:
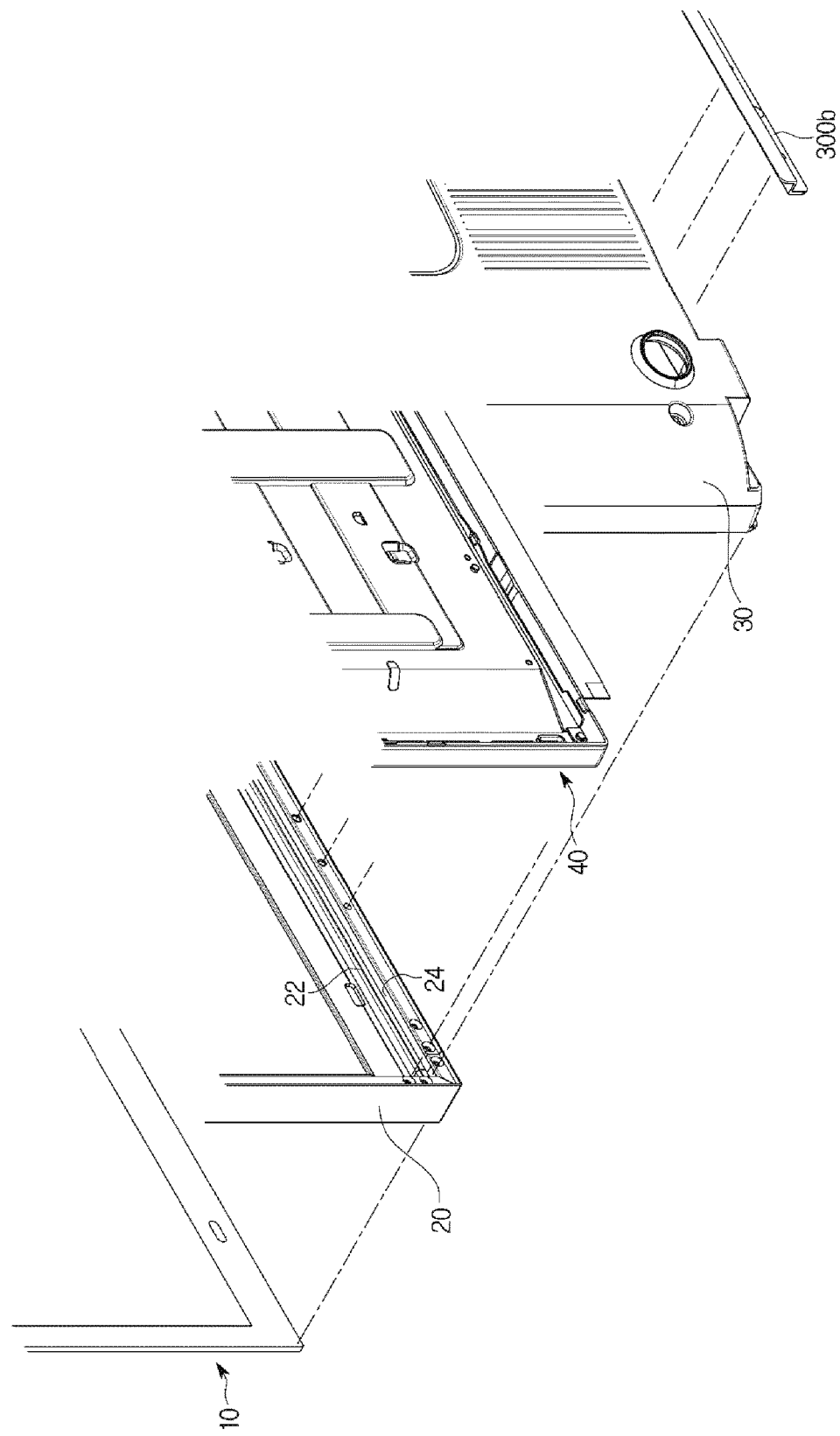
FIG. 4 is an enlarged exploded perspective view illustrating an example coupling structure of a display module and a panel according to an example embodiment of the present disclosure.
Figure 5:
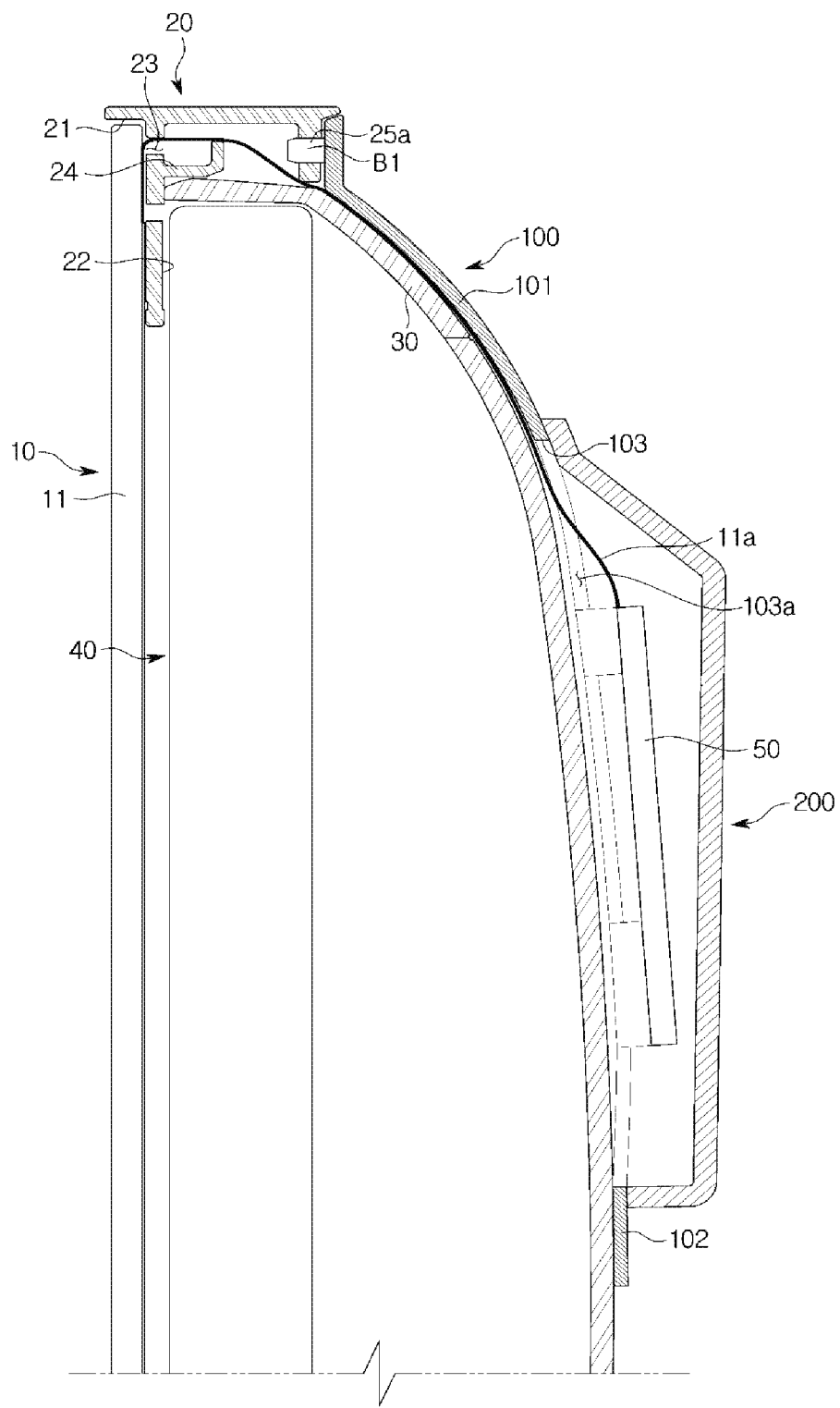
FIG. 5 is a cross-sectional diagram illustrating the display apparatus illustrated in FIG. 2, cut along a line A-A' of FIG. 2.

FIG. 1 is a front perspective view illustrating an example display apparatus according to an example embodiment of the present disclosure, FIG. 2 is a rear perspective view illustrating the rear portion of the display apparatus according to an example embodiment of the present disclosure, FIG. 3 is an exploded perspective view of the display apparatus according to an example embodiment of the present disclosure, FIG. 4 is a diagram illustrating an example of a coupling structure of a display module and a panel according to an example embodiment of the present disclosure, and FIG. 5 is a cross-sectional view of the display apparatus illustrated in FIG. 2, cut along a line A-A' of FIG. 2.

A display apparatus is used to process image signals received from the outside, and to visually display the processed image signals as images. Hereinafter, a case in which the display apparatus is a touch screen display apparatus 1 including a touch panel on substantially the entire surface of the display module will be described as an example, although the display apparatus is not limited to this. For example, the display apparatus may be implemented as one of various types, such as a monitor, a portable multimedia apparatus, a portable communication apparatus, and the like, as long as it can display images visually.

As illustrated in FIGS. 1 to 5, the display apparatus 1 may include a display module 40 configured to display images, a touch panel 10 (hereinafter, simply referred to as a panel) disposed in front of the display module 40, a frame 20 connecting the display module 40 with the panel 10, and a first cover 30 disposed behind the display module 40.

The panel 10 may be disposed in front of the display module 40. The panel 10 may include, for example, a capacitive touch panel configured to detect a user's touch by sensing a change in capacitance between two electrodes, generated when the user's body part touches the panel 10.

The panel 10 may include a tempered glass board 11 forming the outer appearance of the display apparatus 1 (see the cross-sectional view of FIG. 5). The tempered glass board 11, which the user touches, may be made of a glass material, although not limited to this. That is, the tempered glass board 11 may be made of a synthetic resin material having transparency and high strength, such as poly methyl metharcrylate (PMMA) or transparent polycarbonate (PC).

Meanwhile, the panel 10 may include a touch sensing circuit including a first transparent electrode and a second transparent electrode patterned in a predetermined shape, and an insulating layer to isolate the first transparent electrode from the first transparent electrode. The first transparent electrode and the second transparent electrode may be optically transparent to transmit images produced by the display module 40.

The first cover 30 forming the rear portion of the display module 40 may surround at least one portion of the rear surface of the display module 40. More specifically, the first cover 30 may surround the edges of the rear surface of the display module 40. In the current example embodiment, the first cover 30 may surround four edges of the rear surface of the display module 40, although not limited to this. For example, the first cover 30 may surround at least one of four edges of the rear surface of the display module 40.

The first cover 30 may further include a rear cover 32 configured to surround the remaining portion of the rear surface of the display module 40, not surrounded by the first cover 30. The rear cover 32 may surround the center portion of the rear surface of the display module 40. In the current example embodiment, the rear cover 32 may surround the center portion of the display module 40, although not limited to this. For example, the rear cover 32 may be integrated into the first cover 30. Also, the rear cover 32 may be formed in a shape corresponding to the first cover 30, in order to surround the remaining portion of the rear surface of the display module 40, not surrounded by the first cover 30.

The first cover 30 and the rear cover 32 may protect various components included in the display apparatus 1 from external shocks.

The first cover 30 may include a panel driving board installing member 100, e.g., a support structure, on which a panel driving board 50 for driving the panel 10 which will be described later is installed, and a second cover 200 coupled with the panel driving board installing member 100. It is noted that the term installing member is used interchangeably with the term installing support or installing support structure.

The panel driving board installing member 100 may be disposed on the first cover 30. More specifically, the panel driving board installing member 100 may be disposed on the outer side of the first cover 30. Accordingly, the second cover 200 surrounding the panel driving board installing member 100 may be removably coupled with the outer side of the first cover 30. In the current embodiment, the panel driving board installing member 100 may be disposed on the first cover 30, that is, on the display module 40, although not limited to this. For example, the panel driving board installing member 100 may be disposed on at least one of four edges of the display module 40.

The display module 40 may produce an image that is to be displayed for a user, according to the user's command or a control signal input to the panel 10. The display module 40 may adopt a flat display panel (not shown), such as a Liquid Crystal Display (LCD), an Organic Light Emitting Diode (OLED) display, or the like, but is not limited thereto.

Meanwhile, the display module 40 may include a display panel, a back light unit (BLU) disposed behind the display panel, and an optical member, which are not shown. The display panel may block or transmit light generated by the BLU to produce images. More specifically, each of pixels constituting the display panel may block or transmit light generated by the BLU to produce images of various colors.

The display apparatus 1 may include the display module 40 to display image information, and the panel 10 disposed in front of the display module 40, wherein the display module 40 may be coupled with the panel 10 by the frame 20.

The frame 20 may be formed in the shape of a quadrangular ring. In the front portion of the frame 120, the panel 10 may be disposed, and in the rear portion of the frame 120, the display module 40 may be disposed.

Behind the frame 20, the first cover 30 and the rear cover 32 may be disposed to form the rear surface of the display module 40, while forming the outer rear surface of the display apparatus 1.

The frame 20 may include a panel installing portion 21 configured to support the panel 10, a display module supporting portion 22 configured to support the display module 40, a first cover installing portion 24 in which the first cover 30 is installed, and a first coupling portion 25a with which the panel driving board installing member 100 is coupled.

The panel installing portion 21 may be formed in the front portion of the frame 20 to support the edges of the rear surface of the panel 10.

The panel installing portion 21 may protrude toward the center from the inner surface of the frame 20. The panel installing portion 21 may include a connector hole 23. The connector hole 23 may be formed in the upper portion of the panel installing portion 21. A connector 11a extending from the panel 10 may be inserted into the connector hole 23.

The panel 10 may include the connector 11a to connect the panel 10a to the panel driving board 50. The connector 11a may include a flexible printed circuit board.

Accordingly, the connector 11a connected to the panel 10 may extend in the rear direction of the display module 40 through the connector hole 23 of the panel installing portion 21.

Meanwhile, the frame 20 may include the display module supporting portion 22 configured to support the display module 40. The display module supporting portion 22 may be formed on the rear surface of the panel installing portion 21.

The frame 20 may include the first cover installing portion 24 on which the first cover 30 disposed behind the display module 40 is installed. The first cover installing portion 24 may be formed in a shape corresponding to the first cover 30 to be coupled with the edges of the first cover 30.

Also, the frame 20 may include the first coupling portion 25a with which the panel driving board installing member 100 is coupled. The first coupling portion 25a may be formed at the rear end portion of the frame 20. The first coupling portion 25a may be coupled with the panel driving board installing member 100 by a first coupling member B1. The frame 20 may include one or more first coupling portions 25a.

Accordingly, the first cover 30 may be fixed at and supported by the frame 20 through the first coupling portion 25a and the panel driving board installing member 100 disposed on the outer side of the first cover 30.

The first cover 30 may surround the display module 40 behind the display module 40. The first cover 30 may surround the edges of the display module 40. The first cover 30 may include a rear cover installing opening 31 in the center portion. The rear cover 32 may be installed in the rear cover installing opening 31. On the rear portion of the display module 40 corresponding to the rear cover installing opening 31 of the first cover 30, a main board 60, etc. may be mounted to drive the display module 40. The main board 60 of the display module 40 may be connected to the panel driving board 50 of the panel 10. The main board 60 of the display module 40 may be surrounded by the rear cover 32 so as to be protected from the outside.

Meanwhile, the panel driving board installing member 100 provided to install the panel driving board 50 may be exposed to the outside of the first cover 30. The panel driving board installing member 100 may be disposed at the upper portion of the first cover 30. The panel driving board installing member 100 may be coupled with the first coupling portion 25a of the frame 20 outside the first cover 30. The panel driving board 50 may be connected to the connector 11a of the panel 10.

Figure 6:
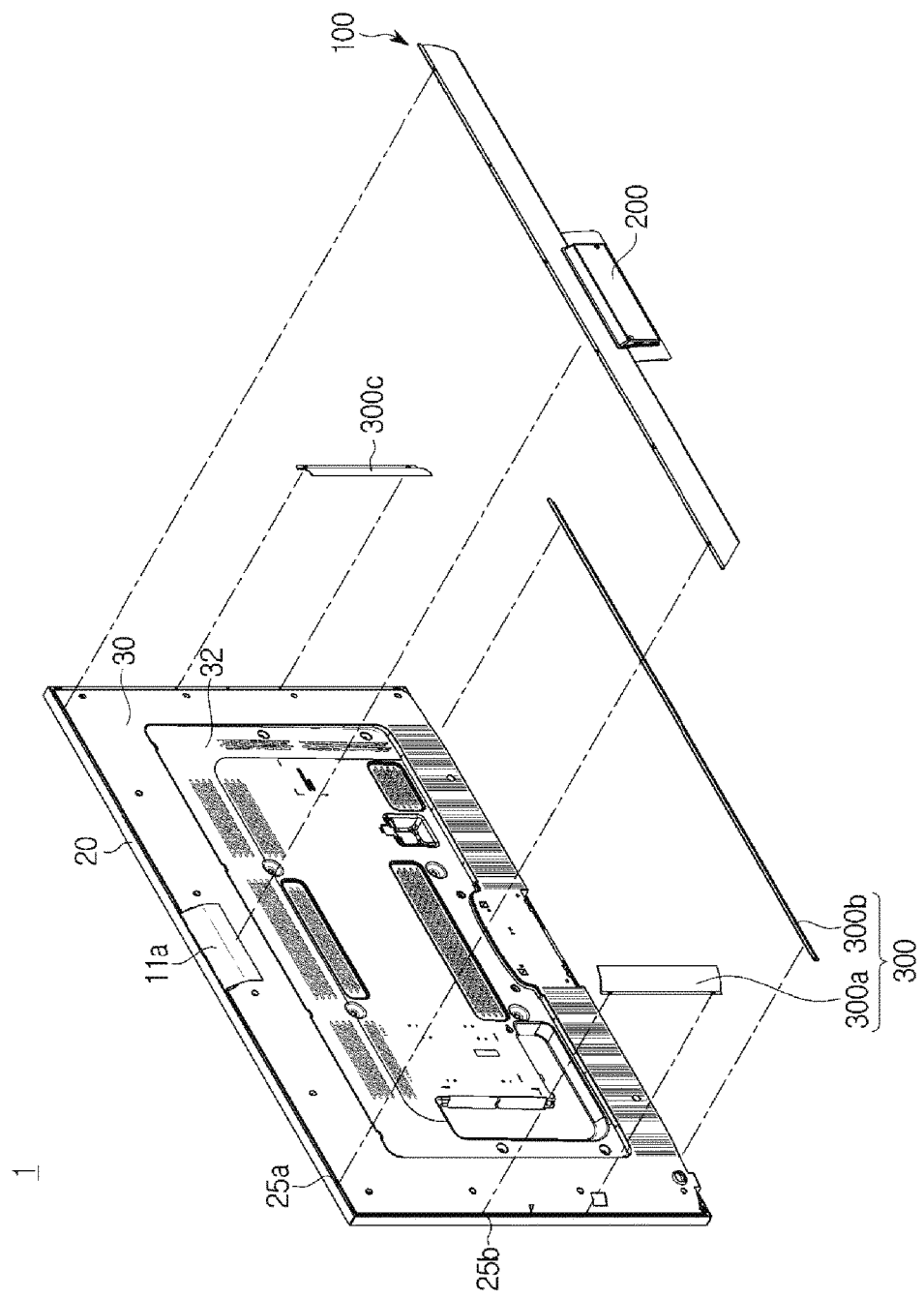
FIG. 6 is a diagram illustrating example coupling of a panel driving board installing member of the display apparatus according to an example embodiment of the present disclosure.
Figure 7:
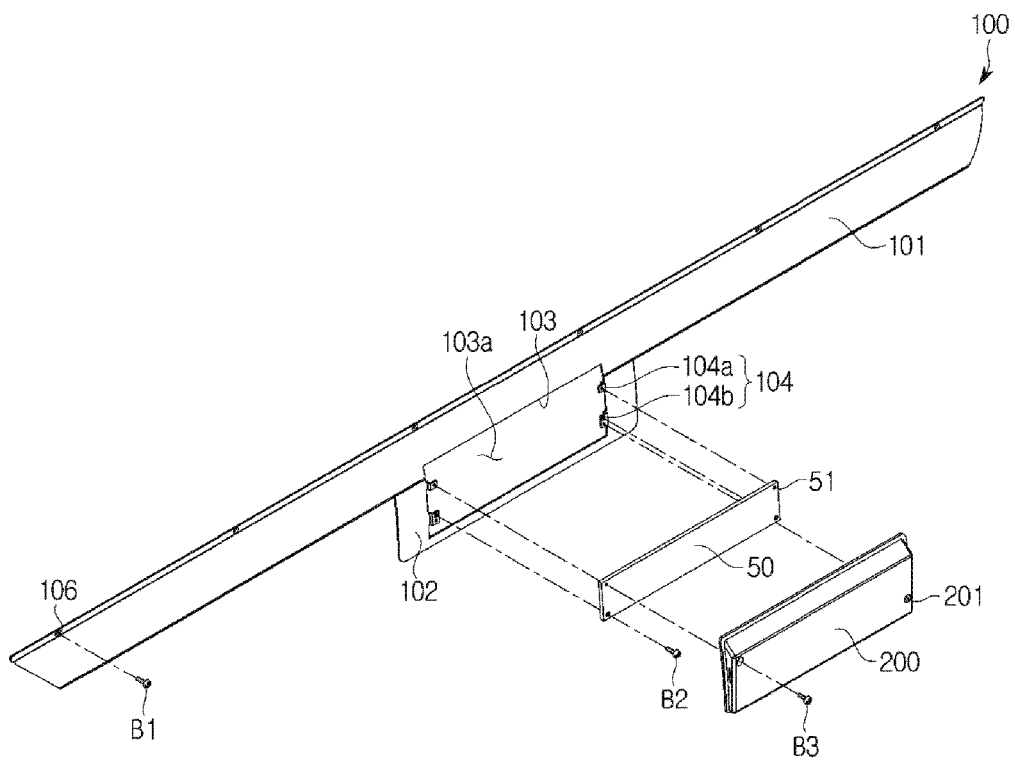
FIG. 7 is a diagram illustrating example coupling of a panel driving board with the panel driving board installing member according to an example embodiment of the present disclosure.

FIG. 6 is a diagram illustrating an example of coupling of a panel driving board installing member of the display apparatus according to an example embodiment of the present disclosure, and FIG. 7 is a diagram illustrating an example of coupling of a panel driving board with the panel driving board installing member according to an example embodiment of the present disclosure.

As illustrated in FIGS. 6 and 7, the panel driving board installing member 100 may include a first body 101, and a second body 102 extending from the first body 101. The first body 101 of the panel driving board installing member 100 may have a length that is equal to or smaller than the horizontal length of the display module 40. The first body 101 may include at least one first fixing portion 106 at the upper end. The first fixing portion 106 of the first body 101 may be coupled with the first coupling portion 25a of the frame 20. Accordingly, the shape and number of the first fixing portion 106 of the first body 101 may correspond to those of the first coupling portion 25a of the frame 20. The first body 101 may be formed in a shape corresponding to the rear surface of the first cover 30. The first body 101 may include a curvature corresponding to that of the first cover 30.

The second body 102 of the panel driving board installing member 100 may extend downward from the center portion of the first body 101. The second body 102 may include an opening portion 103 having at least one opening 103a, and at least one connection portion 104 formed around the opening portion 103. The connection portion may include various connection members, such as, for example, and without limitation, a tab for receiving a screw, a snap-fit arrangement, a support including a hole for receiving a screw or other affixing member, or the like. In the current embodiment, the second body 102 may extend downward from the center portion of the first body 101, although not limited to this. For example, the second body 102 may extend in various directions from the first body 101. Also, the first body 101 and the second body 102 may be integrated into one body, or provided separately.

Meanwhile, in the opening 103a formed in the second body 101, the panel driving board 50 may be disposed. The panel driving board 50 may be connected to the panel driving board installing member 100 through the connection portion 104 formed in the second body 102.

On the outer side of the panel driving board 50, the second cover 200 may be disposed to surround the panel driving board 50. The second cover 200 may be removably positioned on the outer side of the panel driving board 50 to facilitate work of repairing and replacing the panel driving board 50.

The connection portion 104 of the panel driving body installing member 100 may include a first connection portion 104a to which the panel driving board 50 is connected, and a second connection portion 104b to which the second cover 200 is connected.

Accordingly, the panel driving board 50 may be exposed to the outside of the first cover 30 by the panel driving board installing member 100 removably disposed on the first cover 30.

The panel driving board 50 may be protected from the outside by the second cover 200. The second cover 200 may be coupled with the second connection portion 104b of the panel driving board installing member 100 through a third coupling member B3. In the second cover 200, a second cover coupling portion 201 may be formed with which the third coupling member B3 can be removably coupled.

Accordingly, the second cover 200 may be easily decoupled by the third coupling member B3 to expose the panel driving board 50 disposed inside the second cover 200.

Also, the panel driving board 50 may be removably coupled with the panel driving board installing member 100 so that the panel driving board 50 can be easily replaced and repaired.

The panel driving board 50 may be removably connected to the first connection portion 104a of the panel driving board installing member 100 through the second coupling member B2. The panel driving board 50 may include a coupling hole 51 with which the second coupling member B2 is coupled.

The panel driving board installing member 100 may include an aluminum material. Accordingly, the panel driving board installing member 100 can reinforce the weak ground GND. The first coupling member B1 that connects the first fixing portion 106 to the second coupling portion 25a in order to couple the panel driving board installing member 100 with the frame 20 may function as a bridge with the panel driving board 50. Also, the panel driving board 50 may be electrically connected to the panel driving board installing member 100 made of the aluminum material through the first coupling member B1.

Meanwhile, the frame 20 may further include a second coupling portion 25b with which a fixing bracket 300 for supporting the first cover 30 to fix it is coupled. One or more second coupling portions 25b may be respectively formed at the left and right edges of the rear portion of the frame 20.

Also, a first fixing bracket 300a, a second fixing bracket 300b, and a third fixing bracket 300c may be respectively coupled with the second coupling portions 25b.

Figure 8:
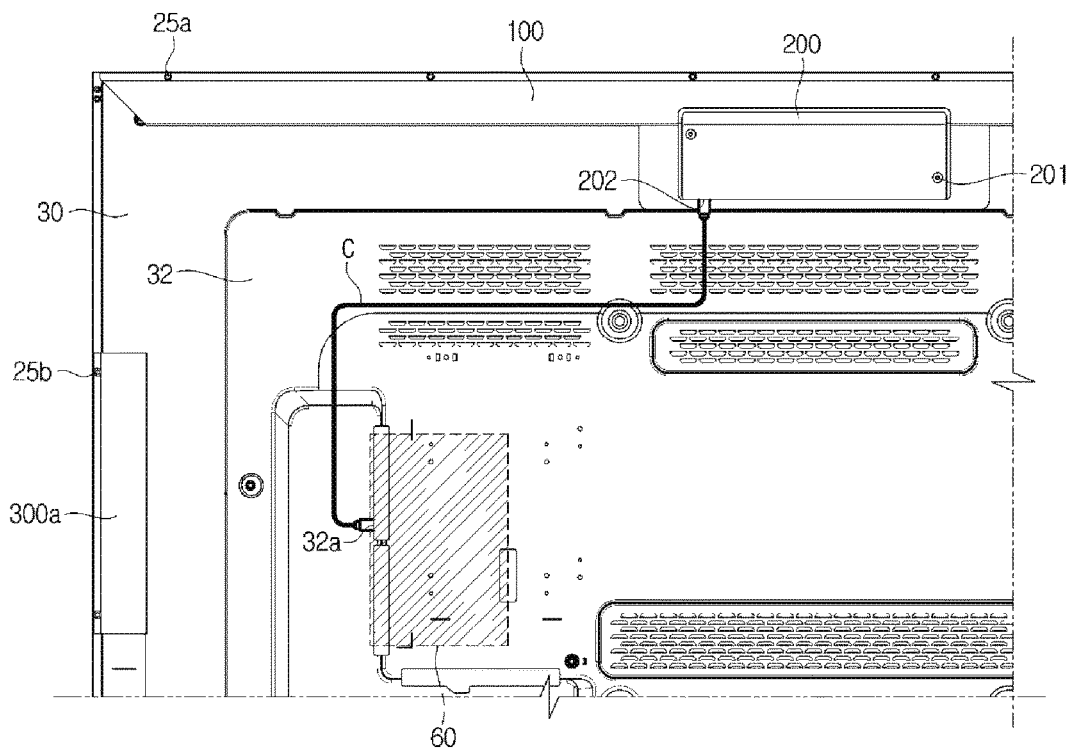
FIG. 8 is a diagram illustrating an example connection structure of a main board and the panel driving board according to an example embodiment of the present disclosure.

FIG. 8 is a diagram illustrating an example connection structure of a main board and the panel driving board according to an example embodiment of the present disclosure.

As illustrated in FIG. 8, the panel driving board 50 may be connected to the main board 60 through a Universal Serial Bus (USB) cable C.

In order to connect the USB cable C to the panel driving board 50, the second cover 200 may include a cable connecting opening 202. The cable connecting opening 202 may be formed in at least one area of the lower portion of the second cover 200.

Also, in order to connect the USB cable C to the main board 60, at least one cable installing opening 32a may be formed in the rear cover 32.

Accordingly, the USB cable C may connect the main board 60 to the panel driving board 50 through the cable installing opening 32a of the rear cover 32 and the cable connecting opening 202 of the second cover 200.

At this time, a molding process may be performed on the cable installing opening 32a and the cable connecting opening 202 in order to prevent and/or reduce foreign materials from entering the cable installing opening 32a and the cable connecting opening 202.

According to example embodiments of the present disclosure, since the driving board connected to the touch panel is disposed on the outer surface of the display apparatus, it is possible to easily repair the driving board, thereby improving the workability and service efficiency of the driving board.

Also, since common use of instrument can be accomplished, it is possible to reduce investment costs for dies of instrument.

Also, since the driving board connected to the touch panel is installed on an aluminum cover for electrical conduction, it is possible to reinforce the weak ground GND.

Although various example embodiments of the present disclosure have been illustrated and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a display module comprising a display panel configured to display an image;
a panel disposed in front of the display module;
a first cover disposed behind the display module;
a panel driving board configured to drive the panel, and disposed to be exposed outside of the first cover;
a panel driving board installing member comprising a support in which the panel driving board is installed,
wherein the panel driving board installing member comprises: an opening; and at least one connection portion comprising at least one connecting tab formed to extend from an inner periphery of the opening, and
wherein the at least one connection portion comprises a first connection portion comprising a first connecting tab to which the panel driving board is connected and a second connection portion comprising a second connecting tab to which a second cover is connected.

2. The display apparatus according to claim 1, further comprising a main board configured to drive the display module, wherein the main board is connectable to the panel driving board.

3. The display apparatus according to claim 2, wherein the second cover is disposed behind the panel driving board and configured to cover the panel driving board.

4. The display apparatus according to claim 1, wherein the first cover further comprises a rear cover configured to cover at least a portion of the rear surface of the display module.

5. The display apparatus according to claim 4, wherein the rear cover is configured to cover the main board.

6. The display apparatus according to claim 1, wherein the panel driving board installing member is removably coupled with the first cover.

7. The display apparatus according to claim 1, wherein the panel driving board installing member comprises an aluminum material.

8. A display apparatus comprising:
a display module comprising a display panel configured to display an image;
a panel disposed in front of the display module;
a first cover forming a rear portion of the display module;
a main board disposed inside the first cover, and configured to drive the display module; and
a panel driving board disposed to be exposed outside of the first cover, and configured to drive the panel,
a panel driving board installing member comprising a support in which the panel driving board is installed,
wherein the panel driving board installing member further comprises an opening and at least one connection portion comprising at least one connecting tab formed at a periphery of the opening portion, and
wherein the connection portion comprises a first connection portion comprising a first connecting tab configured to be connected to the panel driving board and a second connection portion comprising a second connecting tab configured to be connected to a second cover.

9. The display apparatus according to claim 8, wherein the second cover is configured to cover the opening, and to cover the panel driving board.

10. The display apparatus according to claim 8, wherein the panel driving board installing member comprises an aluminum material.

11. The display apparatus according to claim 8, wherein the main board is connectable to the panel driving board.

12. A display apparatus comprising:
a display apparatus comprising a display panel configured to display an image;
a panel disposed in front of the display module;
a main board configured to drive the display module;
a first cover configured to cover the main board;
an opening formed in the first cover;
a panel driving board disposed in the opening, and configured to drive the panel, and
a panel driving board installing member comprising a support in which the panel driving board is installed,
wherein the panel driving board installing member further comprises an opening and at least one connection portion comprising at least one connecting tab formed at a periphery of the opening portion, and
wherein the connection portion comprises a first connection portion comprising a first connecting tab configured to be connected to the panel driving board and a second connection portion comprising a second connecting tab configured to be connected to a second cover.

13. The display apparatus according to claim 12, wherein the second cover is configured to cover the opening.

14. The display apparatus according to claim 12, wherein the panel driving board installing portion comprises an aluminum material.

* * * * *